United States Patent
Yasui et al.

(10) Patent No.: US 11,327,408 B2
(45) Date of Patent: May 10, 2022

(54) WRITING DATA GENERATING METHOD AND MULTI CHARGED PARTICLE BEAM WRITING APPARATUS

(71) Applicant: NuFlare Technology, Inc., Yokohama (JP)

(72) Inventors: Kenichi Yasui, Kawasaki (JP); Noriaki Nakayamada, Kamakura (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/595,677

(22) Filed: Oct. 8, 2019

(65) Prior Publication Data
US 2020/0117095 A1    Apr. 16, 2020

(30) Foreign Application Priority Data
Oct. 15, 2018 (JP) .............................. JP2018-194505

(51) Int. Cl.
*G05B 19/4097* (2006.01)
*G03F 7/20* (2006.01)

(52) U.S. Cl.
CPC ....... *G03F 7/7055* (2013.01); *G05B 19/4097* (2013.01)

(58) Field of Classification Search
CPC .......................... G05B 19/4097; G03F 7/7055
See application file for complete search history.

(56) References Cited

U.S. PATENT DOCUMENTS

| | | | | | |
|---|---|---|---|---|---|
| 4,789,954 | A | * | 12/1988 | Iida ......................... | G09G 1/08 708/270 |
| 5,644,654 | A | * | 7/1997 | Onokera ................. | G06K 9/481 382/199 |
| 5,930,408 | A | * | 7/1999 | Seto ........................ | G06K 15/02 382/301 |
| 6,649,309 | B2 | * | 11/2003 | Mukherjee ................ | G03F 1/36 430/5 |

(Continued)

FOREIGN PATENT DOCUMENTS

| EP | 2 346 000 A1 | 7/2011 |
|---|---|---|
| JP | 63-249193 A | 10/1988 |

(Continued)

OTHER PUBLICATIONS

Vector Addition, retrieved from https://www.grc.nasa.gov/www/k-12/airplane/vectadd.html, published May 5, 2015 (Year: 2015).*

Balram, Krishna C., et al. "The nanolithography toolbox." Journal of Research of the National Institute of Standards and Technology (2016): 464-476 (Year: 2016).*

(Continued)

*Primary Examiner* — Wyatt A Stoffa
(74) *Attorney, Agent, or Firm* — Oblon, McClelland, Maier & Neustadt, L.L.P.

(57) ABSTRACT

In one embodiment, a writing data generating method is for generating writing data used in a multi charged particle beam writing apparatus. The method includes calculating, for a figure containing a curve and a straight line included in design data, a plurality of control points representing the curve and a plurality of vertices of the curve and straight line, and expressing a position of each of the control points and vertices as a displacement from an adjacent control point or vertex to generate the writing data.

4 Claims, 6 Drawing Sheets

(56) References Cited

U.S. PATENT DOCUMENTS

| | | | | |
|---|---|---|---|---|
| 6,723,973 | B2* | 4/2004 | Saito | G06K 9/03 |
| | | | | 238/151 |
| 7,668,373 | B2* | 2/2010 | Mitsui | G06T 7/12 |
| | | | | 382/181 |
| 8,495,527 | B2* | 7/2013 | Bailey | G06F 30/398 |
| | | | | 716/53 |
| 9,558,315 | B2* | 1/2017 | Yasui | H01J 37/3026 |
| 10,685,435 | B2* | 6/2020 | Hara | G06T 7/0004 |
| 10,971,331 | B2* | 4/2021 | Sakamoto | H01J 37/045 |
| 2010/0211352 | A1* | 8/2010 | Morinaga | G03F 9/7046 |
| | | | | 702/150 |
| 2011/0199381 | A1* | 8/2011 | Tamai | G06T 11/20 |
| | | | | 345/442 |
| 2013/0082177 | A1* | 4/2013 | Hiroi | G01N 23/2251 |
| | | | | 250/310 |
| 2016/0103945 | A1* | 4/2016 | Yasui | G06F 30/398 |
| | | | | 250/306 |
| 2017/0193650 | A1* | 7/2017 | Hara | H01J 37/3174 |
| 2017/0316138 | A1* | 11/2017 | Chiang | G06F 7/588 |
| 2020/0388086 | A1* | 12/2020 | Alkouh | G06T 17/00 |
| 2021/0034035 | A1* | 2/2021 | Keenan | H04L 63/06 |

FOREIGN PATENT DOCUMENTS

| | | |
|---|---|---|
| JP | 05-175107 A | 7/1993 |
| JP | 10-283390 A | 10/1998 |
| JP | 2006-38815 A | 2/2006 |
| JP | 2010-113624 A | 5/2010 |
| JP | 201812461 A | 4/2018 |
| KR | 10-1999-0058418 A | 7/1999 |
| KR | 10-2016-0041765 A | 4/2016 |
| TW | 201735108 A | 10/2017 |

OTHER PUBLICATIONS

Combined Taiwanese Office Action and Search Report dated Nov. 24, 2020 in Patent Application No. 108131029 (with English machine translation), 10 pages.

Office Action dated Dec. 12, 2020 in corresponding Korean Patent Application No. 10-2019-0117554 (with English Translation), 9 pages.

Combined Chinese Office Action and Search Report dated Aug. 4, 2021 in Chinese Patent Application No. 201910972026.5 (with English translation), 14 pages.

* cited by examiner

| Header | Code |
| --- | --- |
| | N |
| | other info |
| Body | P0(x0,y0) |
| | P1(2, δx1, δy1) |
| | P2(2, δx2, δy2) |
| | P3(2, δx3, δy3) |
| | P4(1, δx4, δy4) |
| | P5(1, δx5, δy5) |
| | P6(1, δx6, δy6) |
| | P7(1, δx7, δy7) |
| | P8(1, δx8, δy8) |
| | P9(0, δx9, δy9) |
| | P10(0, δx10, δy10) |
| | P11(0, δx11, δy11) |
| | P12(2, δx12, δy12) |
| | P13(2, δx13, δy13) |
| | P14(2, δx14, δy14) |

(flag, displacement in x-direction, displacement in y-direction)

| flag | Meaning |
| --- | --- |
| 0 | Manhattan |
| 1 | Arbitrary Angle |
| 2 | Curve |

WRITING DATA GENERATING METHOD AND MULTI CHARGED PARTICLE BEAM WRITING APPARATUS

CROSS REFERENCE TO RELATED APPLICATION

This application is based upon and claims benefit of priority from the Japanese Patent Application No. 2018-194505, filed on Oct. 15, 2018, the entire contents of which are incorporated herein by reference.

FIELD

The present invention relates to a writing data generating method and a multi charged particle beam writing apparatus.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

As an electron beam writing apparatus, for example, a multi-beam writing apparatus is known, which uses multiple beams to irradiate with many beams at a time and provides improved throughput. In the multi-beam writing apparatus, for example, an electron beam emitted from an electron gun passes through an aperture member with a plurality of holes to form multiple beams, and each beam is blanking-controlled by a blanking plate. Beams that have not been blocked are reduced in size by an optical system and projected onto a mask (writing target) at desired positions.

To perform electron beam writing using the multi-beam writing apparatus, the layout of a semiconductor integrated circuit is designed first to generate design data as layout data. By dividing a polygonal figure contained in the design data into a plurality of trapezoids, writing data input to the multi-beam writing apparatus is generated. The writing data includes, for each of the trapezoids, coordinate data of a placement origin, which is one vertex of the trapezoid, and data representing a displacement from the placement origin to each of the other three vertices.

When the design data includes a figure with curves, such as an elliptical figure, or a figure with both curves and straight lines, the figure is approximated to a polygon to generate writing data. When high-precision approximation is performed, the resulting increase in the number of vertices or figures leads to a larger amount of writing data.

DETAILED DESCRIPTION

In one embodiment, a writing data generating method is for generating writing data used in a multi charged particle beam writing apparatus. The method includes calculating, for a figure containing a curve and a straight line included in design data, a plurality of control points representing the curve and a plurality of vertices of the curve and straight line, and expressing a position of each of the control points and vertices as a displacement from an adjacent control point or vertex to generate the writing data.

An embodiment of the present invention will be described below on the basis of the drawings.

Figure 1:
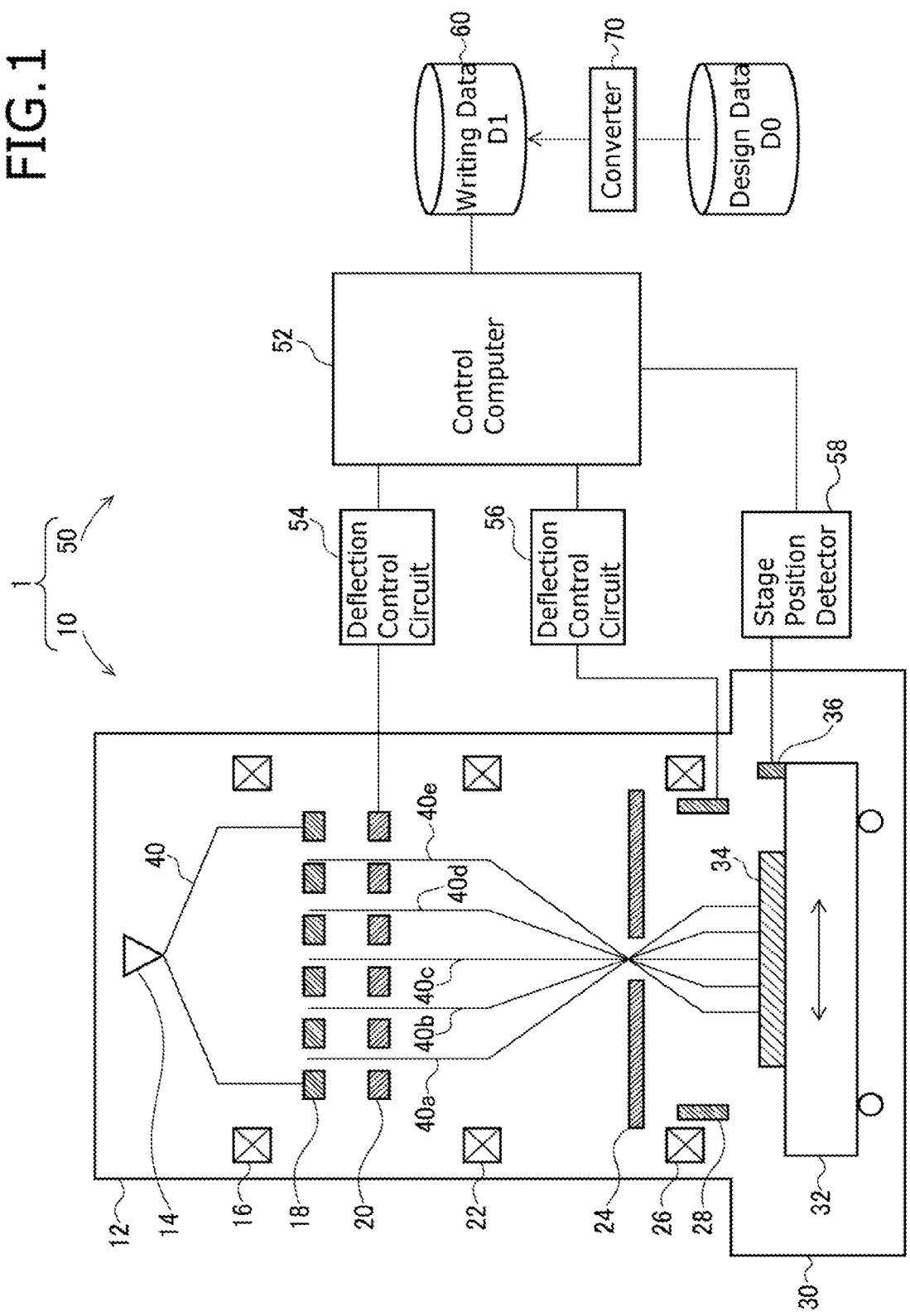
FIG. 1 is a schematic diagram of a multi charged particle beam writing apparatus according to an embodiment of the present invention.

FIG. 1 is a schematic diagram of a multi charged particle beam writing apparatus that performs writing using writing data, according to the present embodiment. The present embodiment describes a configuration that uses electron beams as an example of charged particle beams. The charged particle beams are not limited to electron beams and may be other charged particle beams, such as ion beams.

A writing apparatus 1 illustrated in FIG. 1 includes a writer 10 configured to irradiate a target object, such as a mask or wafer, with electron beams to write a desired pattern thereon, and a controller 50 configured to control the writing operation of the writer 10. The writer 10 includes an electron beam barrel 12 and a writing chamber 30.

The electron beam barrel 12 includes an electron gun 14, an illuminating lens 16, an aperture member 18, a blanking plate 20, a reducing lens 22, a limiting aperture member 24, an objective lens 26, and a deflector 28 which are disposed therein. The writing chamber 30 includes an XY stage 32 disposed therein. A mask blank 34, which is a writing target substrate, is placed on the XY stage 32. Examples of the target object include a wafer and an exposure mask used to transfer a pattern onto a wafer using a step-and-repeat exposure system or extreme ultraviolet exposure system (e.g., stepper or scanner) in which an excimer laser serves as a light source. Examples of the writing target substrate also include a mask having a pattern already formed thereon. For example, for a Levenson mask which requires two writing passes, a mask with a pattern written thereon in the first pass may be subjected to the second pattern writing. A mirror 36 used to measure the position of the XY stage 32 is also disposed on the XY stage 32.

The controller 50 includes a control computer 52, deflection control circuits 54 and 56, and a stage position detector 58. The control computer 52, the deflection control circuits 54 and 56, and the stage position detector 58 are connected to each other via a bus.

An electron beam 40 emitted from the electron gun 14 substantially perpendicularly illuminates the entire aperture member 18 through the illuminating lens 16. The aperture member 18 has holes (openings) arranged in a matrix at a predetermined array pitch. The electron beam 40 illuminates a region including all the holes in the aperture member 18. Allowing part of the electron beam 40 to pass through each of the plurality of holes produces multiple beams 40a to 40e illustrated in FIG. 1.

The blanking plate 20 has through holes which are formed therein to coincide with the respective positions of the holes in the aperture member 18, and each of the through holes is provided with a blanker composed of two electrodes in a pair. The electron beams 40a to 40e passing through the respective through holes are each independently deflected by a voltage applied thereto by the corresponding blanker, and thus blanking-controlled by the deflection. The plurality of blankers thus each perform blanking deflection of a corresponding one of the multiple beams passed through the plurality holes in the aperture member 18.

After passing through the blanking plate 20, the multiple beams 40a to 40e are reduced in size by the reducing lens 22 and travel toward a central hole formed in the limiting aperture member 24. Electron beams deflected by the blankers of the blanking plate 20 deviate from the central hole in the limiting aperture member 24 and are blocked by the limiting aperture member 24. On the other hand, electron beams not deflected by the blankers of the blanking plate 20 pass through the central hole in the limiting aperture member 24.

The limiting aperture member 24 is thus configured to block the beams deflected by the blankers of the blanking plate 20 to be turned off. The beams passed through the limiting aperture member 24 after being turned on before being turned off are beams that form a single shot. The multiple beams 40a to 40e passed through the limiting aperture member 24 are focused by the objective lens 26 to form a pattern image with a desired reduction ratio. The beams (or all multiple beams) passed through the limiting aperture member 24 are deflected together by the deflector 28 in the same direction, and projected onto the mask blank 34 at their respective beam irradiation positions.

During continuous movement of the XY stage 32, the beam irradiation positions are controlled by the deflector 28 to follow the movement of the XY stage 32. The XY stage 32 is moved by a stage control unit (not shown), and the position of the XY stage 32 is detected by the stage position detector 58.

Multiple beams used to irradiate at a time are ideally arranged at a pitch obtained by multiplying the array pitch of the plurality of holes in the aperture member 18 by the desired reduction ratio described above. This writing apparatus performs a writing operation using a raster scanning technique which involves continuous and sequential shot beam irradiation. By blanking control, beams that are required to write a desired pattern are appropriately controlled to be turned on.

The control computer 52 reads writing data D1 from a storage device 60, and performs multiple stages of data conversion to generate shot data specific to the apparatus. In the shot data, the amount of irradiation and the coordinates of the irradiation position of each shot are defined. For example, the control computer 52 assigns a graphic pattern defined in the writing data to corresponding pixels. Then, for each pixel, the control computer 52 calculates the area density of the graphic pattern to be placed.

The control computer 52 calculates, for each pixel, the amount of irradiation of electron beams per shot. For example, the control computer 52 determines the amount of irradiation proportional to the area density of the pixel, and corrects the amount of irradiation by taking into account dimensional variation caused, for example, by a proximity effect, a fogging effect, or a loading effect.

The control computer 52 outputs the amount of irradiation of each shot to the deflection control circuit 54 on the basis of shot data. The deflection control circuit 54 divides the input amount of irradiation by a current density to determine an irradiation time t. To perform the corresponding shot, the deflection control circuit 54 applies a deflection voltage to the corresponding blankers of the blanking plate 20 in such a manner that the blankers keep beams on during the irradiation time t.

At the same time, the control computer 52 outputs deflection position data to the deflection control circuit 56 such that each beam is deflected to a position (coordinates) indicated by the shot data. The deflection control circuit 56 computes the amount of deflection and applies a deflection voltage to the deflector 28. Multiple beams to be shot at a time are thus deflected together.

Figure 2:
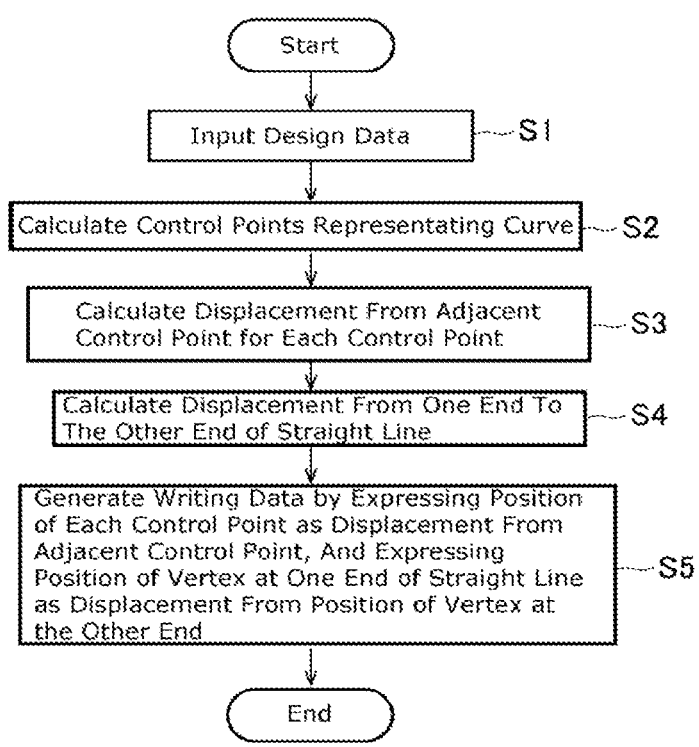
FIG. 2 is a flowchart illustrating a writing data generating method according to the embodiment.

A method for generating the writing data D1 will now be described with reference to the flowchart of FIG. 2. First, the layout of a semiconductor integrated circuit is designed, and design data (CAD data) D0 serving as layout data is generated and input to a converter 70 (step S1). The design data D0 is converted by the converter 70, so that the writing data D1 input to the control computer 52 of the writing apparatus 1 is generated.

The design data D0 includes a figure with curve and straight-line sides. For a curve portion, the converter 70 calculates a plurality of control points for representing the curve (parametric curve representation) and determines the positions of the control points and curve type information (step S2). For each of the control points, the converter 70 determines a displacement from an adjacent control point (step S3). Also, the converter 70 extracts a straight-line portion and determines a displacement from one end to the other end of the straight line (step S4). Then, along the entire contour of the figure starting at one vertex (figure placement origin), the converter 70 expresses the position of each control point as a displacement from the adjacent control point, and also expresses the position of a vertex at one end of the straight line as a displacement from the position of a vertex at the other end of the straight line. The converter 70 thus defines information about each side to generate the writing data D1 (step S5).

Figure 3:
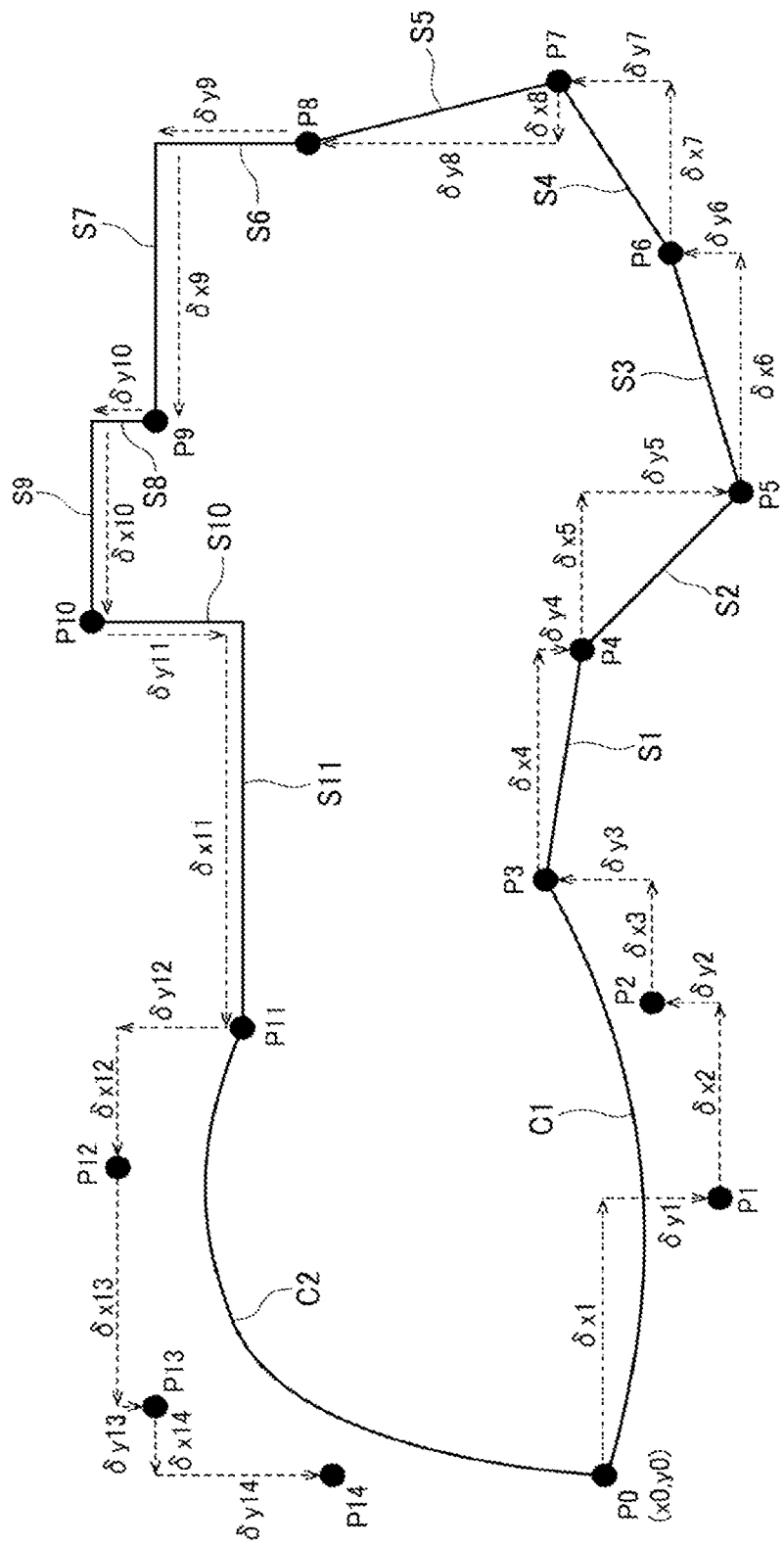
FIG. 3 is a diagram illustrating an exemplary representation of a figure containing both curves and straight lines.

FIG. 3 illustrates an exemplary figure containing both curves and straight lines. This figure is enclosed by curves C1 and C2 and straight lines S1 to S11.

In the example illustrated in FIG. 3, the curve C1 is represented (or approximated) by a curve defined by four control points P0, P1, P2, and P3. Exemplary curve types that can be used here include a B-spline curve and a Bezier curve. The converter 70 calculates control points representing the curve portion of the figure, and expresses the position of each control point as a displacement from the adjacent control point to generate the writing data D1.

For example, in the example illustrated in FIG. 3, the coordinates (x0, y0) of the vertex (control point) P0 are defined as the figure placement origin of this figure.

Of the control points for the curve C1, the control point P1 follows the control point P0 (or is next to the control point P0). The position of the control point P1 is defined by a displacement δx1 in the x-direction and a displacement δy1 in the y-direction, as viewed from the control point P0.

The position of the control point P2 following the control point P1 is defined by a displacement δx2 in the x-direction and a displacement δy2 in the y-direction, as viewed from the control point P1.

The position of the control point P3 following the control point P2 is defined by a displacement δx3 in the x-direction and a displacement δy3 in the y-direction, as viewed from the control point P2. In this manner, the positions of the control points for the curve portion are sequentially defined, each by a displacement in the x-direction and a displacement in the y-direction as viewed from the preceding control point.

The straight line S1 connects to the curve C1 at the vertex (control point) P3. The straight line S1 connects the vertex P3 to a vertex P4. The position of the vertex P4 is defined by a displacement δx4 in the x-direction and a displacement δy4 in the y-direction, as viewed from the vertex P3. The converter 70 uses the positions of the vertex P3 and the vertex P4 and the information indicating that the vertex P3 and the vertex P4 are connected by a straight line to express the straight line S1 and generate the writing data D1.

The straight line S2 connects to the straight line S1 at the vertex P4. The straight line S2 connects the vertex P4 to a vertex P5. The position of the vertex P5 is defined by a displacement δx5 in the x-direction and a displacement δy5 in the y-direction, as viewed from the vertex P4. The converter 70 uses the positions of the vertex P4 and the vertex P5 and the information indicating that the vertex P4 and the vertex P5 are connected by a straight line to express the straight line S2 and generate the writing data D1.

The straight line S3 connects to the straight line S2 at the vertex P5. The straight line S3 connects the vertex P5 to a vertex P6. The position of the vertex P6 is defined by a displacement δx6 in the x-direction and a displacement δy6 in the y-direction, as viewed from the vertex P5. The converter 70 uses the positions of the vertex P5 and the vertex P6 and the information indicating that the vertex P5 and the vertex P6 are connected by a straight line to express the straight line S3 and generate the writing data D1.

The straight line S4 connects to the straight line S3 at the vertex P6. The straight line S4 connects the vertex P6 to a vertex P7. The position of the vertex P7 is defined by a displacement δx7 in the x-direction and a displacement δy7 in the y-direction, as viewed from the vertex P6. The converter 70 uses the positions of the vertex P6 and the vertex P7 and the information indicating that the vertex P6 and the vertex P7 are connected by a straight line to express the straight line S4 and generate the writing data D1.

The straight line S5 connects to the straight line S4 at the vertex P7. The straight line S5 connects the vertex P7 to a vertex P8. The position of the vertex P8 is defined by a displacement δx8 in the x-direction and a displacement δy8 in the y-direction, as viewed from the vertex P7. The converter 70 uses the positions of the vertex P7 and the vertex P8 and the information indicating that the vertex P7 and the vertex P8 are connected by a straight line to express the straight line S5 and generate the writing data D1.

The straight line S6 connects to the straight line S5 at the vertex P8 at one end of the straight line S6. The other end of the straight line S6 is connected to one end of the straight line S7, and the straight line S6 and the straight line S7 form a right angle. The position of a vertex P9 at the other end of the straight line S7 is defined by a displacement δx9 in the x-direction and a displacement δy9 in the y-direction, as viewed from the vertex P8. The converter 70 uses the positions of the vertex P8 and the vertex P9 and the information indicating that the vertex P8 and the vertex P9 are connected by straight lines of a right-angle type (Manhattan type) to express the straight lines S6 and S7 and generate the writing data D1.

The straight line S8 connects to the straight line S7 at the vertex P9 at one end of the straight line S8. The other end of the straight line S8 is connected to one end of the straight line S9, and the straight line S8 and the straight line S9 form a right angle. The position of a vertex P10 at the other end of the straight line S9 is defined by a displacement δx10 in the x-direction and a displacement δy10 in the y-direction, as viewed from the vertex P9. The converter 70 uses the positions of the vertex P9 and the vertex P10 and the information indicating that the vertex P9 and the vertex P10 are connected by straight lines of the right-angle type (Manhattan type) to express the straight lines S8 and S9 and generate the writing data D1.

The straight line S10 connects to the straight line S9 at the vertex P10 at one end of the straight line S10. The other end of the straight line S10 is connected to one end of the straight line S11, and the straight line S10 and the straight line S11 form a right angle. The position of a vertex P11 at the other end of the straight line S11 is defined by a displacement δx11 in the x-direction and a displacement δy11 in the y-direction, as viewed from the vertex P10. The converter 70 uses the positions of the vertex P10 and the vertex P11 and the information indicating that the vertex P10 and the vertex P11 are connected by straight lines of the right-angle type (Manhattan type) to express the straight lines S10 and S11 and generate the writing data D1.

The curve C2 is represented (or approximated) by a curve connecting the vertices P0 and P11 and defined by five control points P11, P12, P13, P14, and P0. The position of the control point P12 following the control point (vertex) P11 is defined by a displacement δx12 in the x-direction and a displacement δy12 in the y-direction, as viewed from the control point P11.

The position of the control point P13 following the control point P12 is defined by a displacement δx13 in the x-direction and a displacement δy13 in the y-direction, as viewed from the control point P12.

The position of the control point P14 following the control point P13 is defined by a displacement δx14 in the x-direction and a displacement δy14 in the y-direction, as viewed from the control point P13.

The control point P0 following the control point P14 is the figure placement origin.

Figure 4:
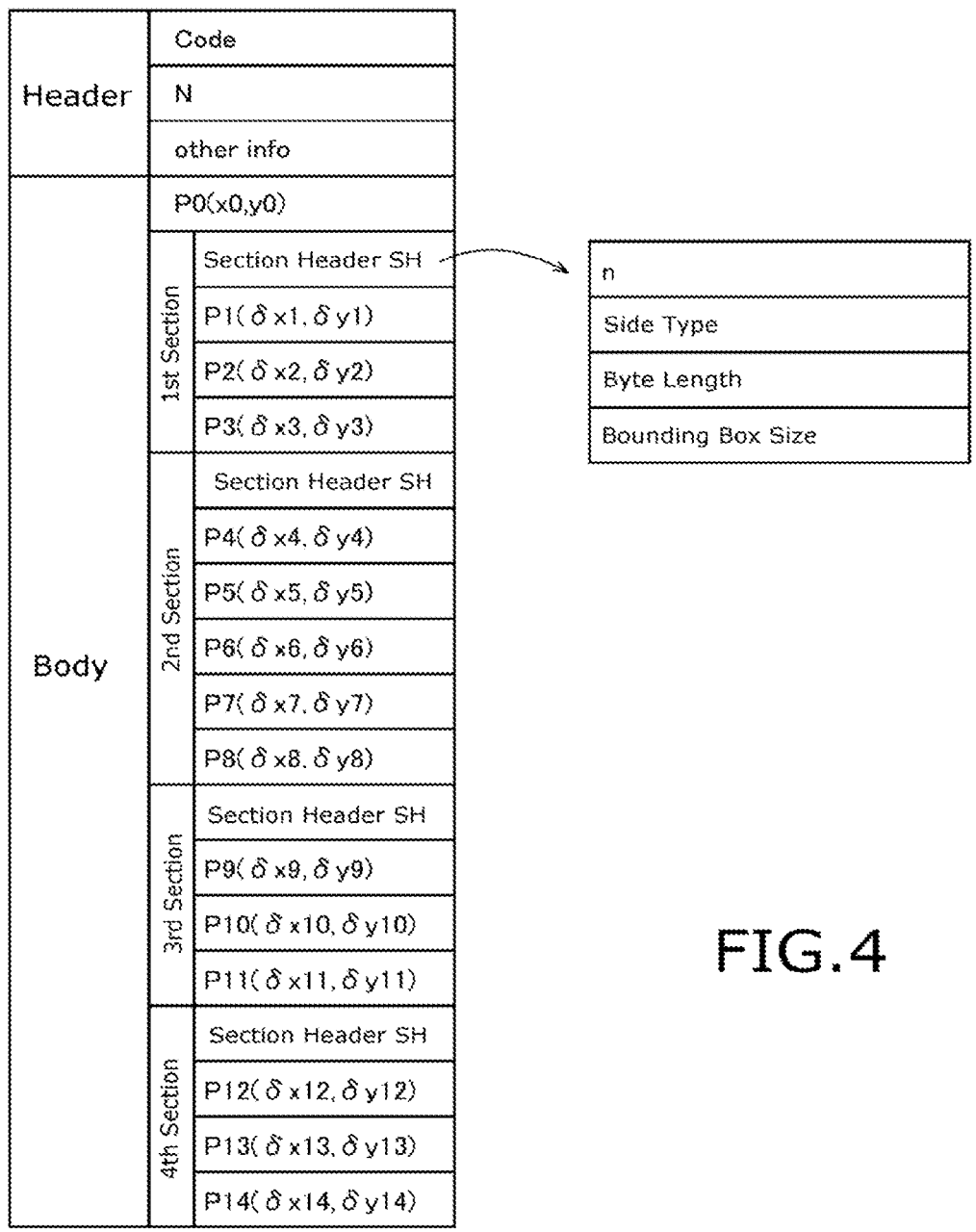
FIG. 4 is a diagram illustrating an exemplary data structure of writing data.

FIG. 4 illustrates an exemplary data structure of the writing data D1 that defines a figure containing both curves and straight lines. The writing data D1 includes a header and a body. The header defines a figure code (Code), the number of sections (N), and other information (other info).

The figure code is information indicating the type of a figure defined. For a figure containing both curves and straight lines, information indicating "mixed-side type" is defined as the figure code.

The converter 70 generates the writing data D1, with curve and straight-line portions separated in different sections. Also, the converter 70 groups continuous straight lines of an arbitrary-angle type (non-right-angle type) into one section. Similarly, the converter 70 groups continuous straight lines of the right-angle type into one section.

In the exemplary figure illustrated in FIG. 3, the positional information of the control points P1 to P3 for representing the curve C1 is categorized into a first section. The positional information of the vertices P4 to P8 for representing the straight lines S1 to S5 of the arbitrary-angle type is categorized into a second section. The positional information of the vertices P9 to P11 for representing the straight lines S6 to S11 of the right-angle type is categorized into a third section. The positional information of the control points P12 to P14 for representing the curve C2 is categorized into a fourth section.

Figure 5:
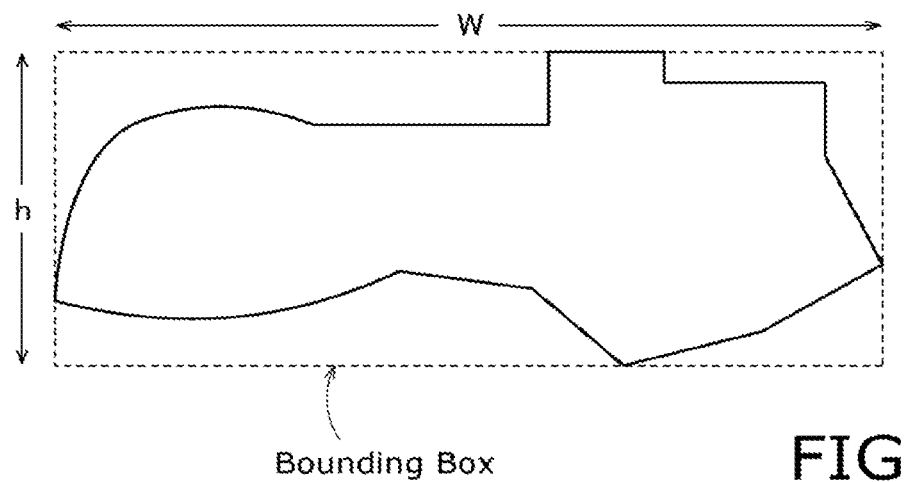
FIG. 5 is a diagram illustrating an exemplary bounding box.

As the other information (other info), the size (w and h) of the minimum rectangle (bounding box) enclosing the figure, such as that illustrated in FIG. 5, is defined. Such information of the bounding box facilitates determination of whether there is any overlap with other figures. Parameters for determining the parametric curve, such as a curve type, order, knot vector information, and end-point information, are also set.

In the body, the coordinates (x0, y0) of the figure placement origin P0 are first described. After the figure placement origin, information of each section is sequentially defined.

The number of points n, side type, byte length, and bounding box size are defined in a section header SH of each section. The number of points n indicates the number of control points or vertices included in the section. For example, the number of points n for the first section is three, and the number of points n for the second section is five.

The side type indicates the type of a side represented (i.e., curve, straight lines of arbitrary-angle type, or straight lines of right-angle type). The byte length indicates the data length of positional information (displacement information) of vertices or control points. The bounding box size indicates the size of a bounding box that encloses the side defined in this section.

In the first section, "curve type" is defined as the side type in the section header, and positional information (displacement information) of the control points P1 to P3 is defined following the section header. Specifically, as the positional information of the control point P1, the displacement $\delta x1$ in the x-direction and the displacement $\delta y1$ in the y-direction, as viewed from the figure placement origin (x0, y0), are defined. As the positional information of the control point P2, the displacement $\delta x2$ in the x-direction and the displacement $\delta y2$ in the y-direction, as viewed from the control point P1, are defined. As the positional information of the control point P3, the displacement $\delta x3$ in the x-direction and the displacement $\delta y3$ in the y-direction, as viewed from the control point P2, are defined.

In the second section, "straight lines of arbitrary-angle type" is defined as the side type in the section header, and positional information of the vertices P4 to P8 is sequentially defined following the section header. The positional information of each vertex is a displacement in the x-direction and a displacement in the y-direction from the preceding vertex.

In the third section, "straight lines of right-angle type" is defined as the side type in the section header, and positional information of the vertices P9 to P11 is sequentially defined following the section header. The positional information of each vertex is a displacement in the x-direction and a displacement in the y-direction from the preceding vertex.

In the fourth section, "curve type" is defined as the side type in the section header, and positional information of the control points P12 to P14 is sequentially defined following the section header. The positional information of each control point is a displacement in the x-direction and a displacement in the y-direction from the preceding control point.

If an area enclosed by a curve is approximated to a polygon as in the case of using a conventional technique, the resulting increase in the number of vertices leads to a larger amount of writing data.

In the present embodiment, on the other hand, a curve portion of a figure is represented by a parametric curve using a plurality of control points. Since the number of control points used here is smaller than the number of vertices used in polygonal approximation of a curve, the amount of the writing data D1 can be reduced.

The control computer 52 reads the writing data D1 and reconstructs the figure. For example, from the coordinates (x0, y0) in the writing data D1, the control computer 52 determines the position of the control point P0 serving as the figure placement origin.

From the information defined in the first section, the control computer 52 sequentially calculates the positions of the control points P1 to P3 to determine the curve C1.

Next, from the information defined in the second section, the control computer 52 calculates the positions of the vertices P4 to P8 to determine the straight lines S1 to S5.

Next, from the information defined in the third section, the control computer 52 calculates the positions of the vertices P9 to P11 to determine the straight lines S6 to S11 that connect the vertices with sides of the right-angle type.

Then, from the information defined in the fourth section, the control computer 52 calculates the positions of the control points P12 to P14 to determine the curve C2 that connects the vertices P0 and P11. The figure enclosed by the curves C1 and C2 and the straight lines S1 to S11 is thus reconstructed.

As described above, the writing data D1 representing a figure containing both curves and straight lines can be easily processed within the control computer 52 of the writing apparatus 1, and the amount of calculation can be reduced. With the writing apparatus 1 that supports a curve format, it is possible to deal with curves in an upstream data path, including optical proximity correction (OPC), and thus to reduce the turnaround time (TAT) even in an upstream process.

Figures 6, 7:
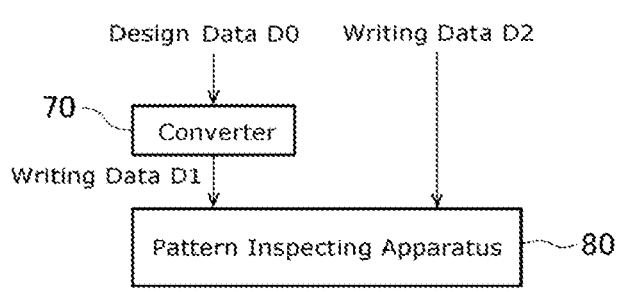
FIG. 6 is a diagram illustrating an exemplary data structure of writing data according to another embodiment.
FIG. 7 is a schematic block diagram of a pattern inspecting apparatus.

The embodiment has described an example in which curve and straight-line portions are separated into different sections and the side type is defined in each section header to generate the writing data D1. Alternatively, as illustrated in FIG. 6, a flag indicating the type of a side to which each vertex (or control point) belongs and a displacement from the preceding vertex (or control point) may be defined sequentially, along the contour of the figure starting at the figure placement origin. In this case, N in the header indicates the total number of vertices and control points.

For example, a flag 0 indicates Manhattan (or straight lines of the right-angle type), a flag 1 indicates straight lines of the arbitrary-angle type, and a flag 2 indicates curve.

The control points P1 to P3, which are points for representing a curve, are assigned a flag of 2. The vertices P4 to P8, which are points for representing straight lines of the arbitrary-angle type, are assigned a flag of 1. The vertices P9 to P11, which are points for representing straight lines of the right-angle type, are assigned a flag of 0. The control points P12 to P14, which are points for representing a curve, are assigned a flag of 2.

The writing data D1 generated by the converter 70 according to the embodiment may be input to a pattern inspecting apparatus. For example, as illustrated in FIG. 7, the writing data D1 (first writing data) generated by the converter 70 and writing data D2 (second writing data) are input to a pattern inspecting apparatus 80. The writing data D2 is generated on the basis of a pattern actually written on a writing target substrate by the writing apparatus 1 illustrated in FIG. 1 on the basis of the writing data D1. The writing data D2 is input to the pattern inspecting apparatus 80 from a storage device (not shown) through a wired or wireless network.

On the basis of the writing data D1 and D2 received, the pattern inspecting apparatus 80 inspects a pattern actually written on the writing target substrate by the writing apparatus 1. The inspection involves, for example, comparing the writing data D1 and the writing data D2. Various types of other information, such as writing conditions, are also used in the inspection.

The writing data D1 generated by the converter 70 is small in size and can be readily processed. This improves processing efficiency of the pattern inspecting apparatus 80.

The converter 70 may be included in the pattern inspecting apparatus 80. In this case, the pattern inspecting apparatus 80 includes a converting unit that generates the writing data D1 on the basis of the design data D0 input thereto, and an inspecting unit that compares the writing data D1 and the writing data D2 to inspect a pattern actually written on the writing target substrate.

Generation of the writing data D1 according to the embodiment may be performed in the control computer 52 of the writing apparatus 1.

At least part of the converter 70 for generating the writing data D1 described in the above embodiments may be implemented in either hardware or software. When implemented in software, a program that realizes at least part of functions of the converter 70 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the converter 70 may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A writing data generating method for generating writing data used in a multi charged particle beam writing apparatus, the method comprising:
    calculating, by a computer, for a figure containing a curve and a straight line included in design data, a plurality of control points representing the curve and a plurality of vertices of the curve and the straight line;
    generating a data structure of the writing data by expressing, by the computer, a position of each of the control points as a displacement from an adjacent control point and expressing a position of each of the vertices as a displacement from an adjacent vertex; and
    controlling a writing operation of the figure using charged particle beams based on the generated data structure of the writing data,
    wherein a curve portion formed by the curve and a straight-line portion formed by the straight line are defined sequentially from an origin of the figure to the origin along a contour of the figure to generate the data structure of the writing data,
    wherein the data structure of the writing data includes displacement information indicating the displacement from the adjacent control point for each of the control points and the displacement from the adjacent vertex for each of the vertices, and side type information indicating a side type of the curve or the straight line, and
    wherein the side type information of the straight line indicates that the straight line is of an arbitrary-angle type or of a right-angle type.

2. The method according to claim 1, wherein size information indicating a size of a rectangle enclosing the figure is defined in the data structure of the writing data.

3. The method according to claim 1, wherein the side type information of the curve indicates that the curve is a B-spline curve or a Bezier curve.

4. The method according to claim 1, wherein the data structure of the writing data includes a header, a first section corresponding to the curve, and a second section corresponding to the straight line.

* * * * *